(12) United States Patent
Tiwari et al.

(10) Patent No.: US 11,476,268 B2
(45) Date of Patent: Oct. 18, 2022

(54) METHODS OF FORMING ELECTRONIC DEVICES USING MATERIALS REMOVABLE AT DIFFERENT TEMPERATURES

(71) Applicant: Micron Technology, Inc., Boise, ID (US)

(72) Inventors: Chandra S. Tiwari, Boise, ID (US); Kunal Shrotri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 16/887,178

(22) Filed: May 29, 2020

(65) Prior Publication Data

US 2021/0375898 A1 Dec. 2, 2021

(51) Int. Cl.
*H01L 27/11556* (2017.01)
*H01L 27/11585* (2017.01)
*H01L 27/11519* (2017.01)

(52) U.S. Cl.
CPC .. *H01L 27/11556* (2013.01); *H01L 27/11585* (2013.01); *H01L 27/11519* (2013.01)

(58) Field of Classification Search
CPC ......... H01L 27/11556; H01L 27/11585; H01L 27/11519; H01L 27/11582
See application file for complete search history.

(56) References Cited

U.S. PATENT DOCUMENTS

| | | | |
|---|---|---|---|
| 7,393,699 B2 | 7/2008 | Tran | |
| 8,088,685 B2 | 1/2012 | Lin et al. | |
| 8,154,678 B2 | 4/2012 | Kimura et al. | |
| 8,803,206 B1 | 8/2014 | Or-Bach et al. | |
| 8,987,079 B2 | 3/2015 | Or-Bach | |
| 9,431,416 B2 * | 8/2016 | Nam | H01L 29/66666 |
| 9,640,423 B2 | 5/2017 | Krishnan et al. | |
| 9,640,531 B1 | 5/2017 | Or-Bach et al. | |
| 9,666,590 B2 | 5/2017 | Chien et al. | |
| 9,735,256 B2 | 8/2017 | Chang et al. | |
| 10,014,292 B2 | 7/2018 | Or-Bach et al. | |
| 10,115,723 B2 | 10/2018 | Xu | |
| 10,147,634 B2 | 12/2018 | Jhaveri et al. | |
| 10,325,912 B2 | 6/2019 | Chen et al. | |
| 10,460,933 B2 | 10/2019 | Manna et al. | |
| 10,468,259 B2 | 11/2019 | Purayath et al. | |

(Continued)

*Primary Examiner* — Allison Bernstein
(74) *Attorney, Agent, or Firm* — TraskBritt

(57) ABSTRACT

A method comprising forming a stack precursor comprising alternating first materials and second materials, the first materials and the second materials exhibit different melting points. A portion of the alternating first materials and second materials is removed to form a pillar opening through the alternating first materials and second materials. A sacrificial material is formed in the pillar opening. The first materials are removed to form first spaces between the second materials, the first materials formulated to be in a liquid phase or in a gas phase at a first removal temperature. A conductive material is formed in the first spaces. The second materials are removed to form second spaces between the conductive materials, the second materials formulated to be in a liquid phase or in a gas phase at a second removal temperature. A dielectric material is formed in the second spaces. The sacrificial material is removed from the pillar opening and cell materials are formed in the pillar opening.

28 Claims, 7 Drawing Sheets

(56) References Cited

U.S. PATENT DOCUMENTS

| | | |
|---|---|---|
| 10,535,733 B2 | 1/2020 | Cheng et al. |
| 10,553,439 B2 | 2/2020 | Dasgupta et al. |
| 10,553,498 B2 | 2/2020 | Bao et al. |
| 2013/0187236 A1 | 7/2013 | Xie et al. |
| 2014/0306290 A1 | 10/2014 | Alptekin et al. |
| 2015/0118811 A1 | 4/2015 | Makala et al. |
| 2016/0053386 A1 | 2/2016 | Mizutani et al. |
| 2016/0056054 A1 | 2/2016 | Takahashi et al. |
| 2017/0084345 A1 | 3/2017 | Yang et al. |
| 2017/0263731 A1 | 9/2017 | Cheng et al. |
| 2018/0350785 A1 | 12/2018 | Fong et al. |
| 2018/0374760 A1 | 12/2018 | Chan et al. |
| 2019/0157164 A1 | 5/2019 | Mathieu et al. |
| 2019/0221565 A1 | 7/2019 | Gluschenkov et al. |
| 2019/0227749 A1 | 7/2019 | Wakchaure et al. |
| 2019/0378913 A1 | 12/2019 | Li et al. |
| 2020/0006518 A1 | 1/2020 | Huang et al. |
| 2020/0044025 A1 | 2/2020 | Liu et al. |

\* cited by examiner

US 11,476,268 B2

METHODS OF FORMING ELECTRONIC DEVICES USING MATERIALS REMOVABLE AT DIFFERENT TEMPERATURES

TECHNICAL FIELD

Embodiments disclosed herein relate to electronic devices and electronic device fabrication. More particularly, embodiments of the disclosure relate to methods of forming electronic devices using materials formulated to be removable at different temperatures.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers desire to design the compact architectures using simplified designs. Reducing the dimensions and spacing of features has placed increasing demands on methods used to form the electronic devices. One solution has been to form three-dimensional (3D) electronic devices in which the features are arranged vertically rather than horizontally. To form the 3D electronic devices, multiple materials are positioned over one another and are etched to form stacks of the materials separated from one another by openings. The features are formed in the openings. The stacks of the materials initially include alternating dielectric materials and nitride materials. The nitride materials are subsequently removed and replaced with conductive materials by a so-called "replacement gate" process. The nitride materials are selectively removed relative to the dielectric materials based on differences in etch selectivity. After the replacement gate process, the stacks include tiers of alternating dielectric materials and conductive materials. As spacing between adjacent stacks continues to decrease with increasing memory density, the conventional replacement gate process is yield limiting and has problems with scalability and defectivity. Etching the stacks of the alternating dielectric materials and nitride materials utilizes multiple masks, which are expensive. In addition, the openings in the stacks are formed by plasma enhanced (PE) chemical vapor deposition (CVD), which induces localized stress on the etched materials.

To further increase the memory density of the features, increased numbers of tiers (e.g., the number of alternating dielectric materials and conductive materials) are formed. However, with the increased numbers of tiers, the stacks and/or features exhibit bending, deformation, and localized stress. To achieve the increased numbers of tiers, multiple decks, each including a smaller number of tiers, are formed and positioned vertically adjacent to one another. However, alignment of the decks is problematic and misalignment of the features and stacks occurs. The increased numbers of tiers also results in a higher cost of forming the 3D electronic devices because forming the openings and features in the stacks accounts for a large proportion of the overall cost.

DETAILED DESCRIPTION

Figure 1:
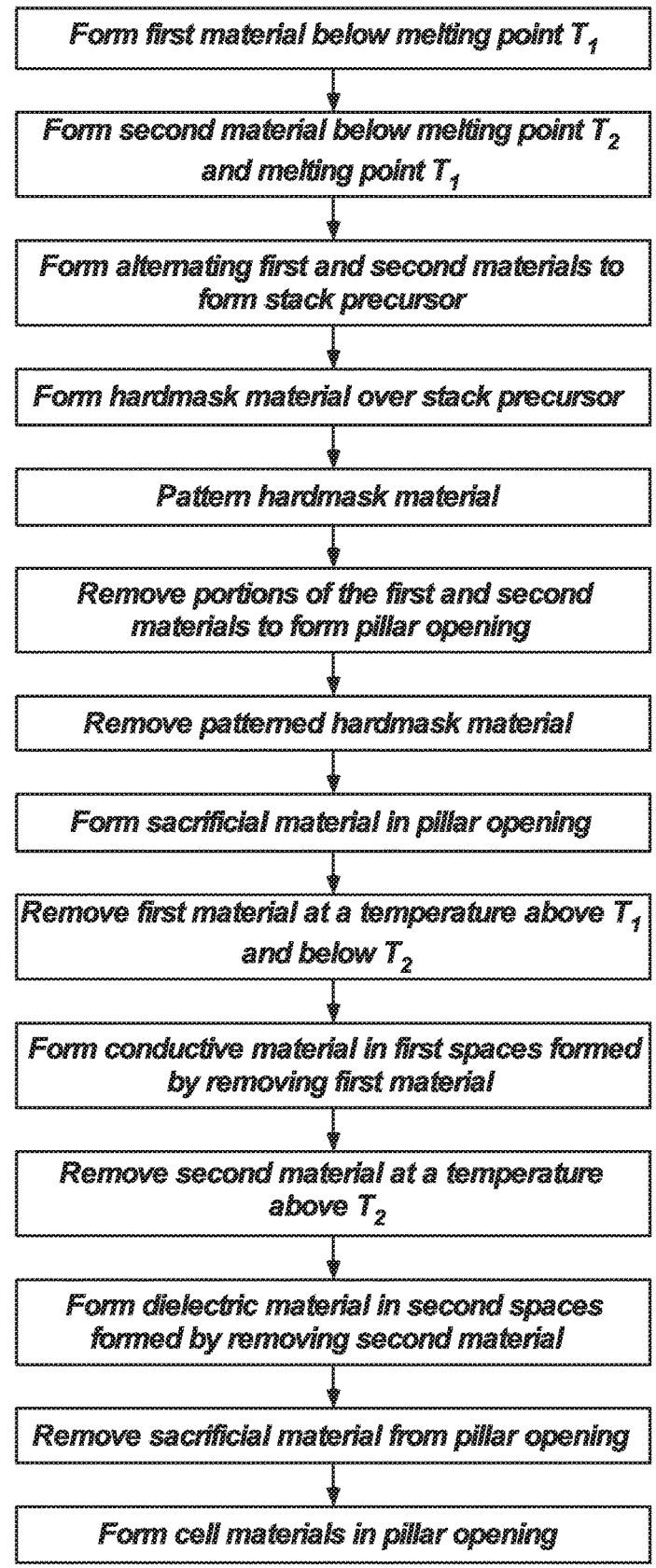
FIG. 1 is a flow chart of process acts conducted to form an electronic device according to embodiments of the disclosure.

A method of forming an electronic device including a stack of materials is disclosed. The stack of materials is formed using materials of a stack precursor that are selectively removable relative to one another based on a difference between melting points of the stack precursor materials. The stack precursor materials exhibit a sufficient difference between their respective melting points such that one of the stack precursor materials is selectively removable by increasing the temperature above the melting point of the respective stack precursor material. Another of the stack precursor materials is selectively removable by increasing the temperature above the melting point of the another stack precursor material. Thermal selectivity is, therefore, used to remove the stack precursor materials at different times during the fabrication process of forming the electronic device. The method includes forming the materials of the stack precursor at a temperature below the respective melting points of the stack precursor materials and removing the respective stack precursor materials using a phase transformation of the materials of the stack precursor. Each of the materials of the stack precursor is separately removed by increasing the temperature of the stack precursor above the melting point of the stack precursor material. One of the materials of the stack precursor is selectively removed and replaced with a stack material and another of the materials of the stack precursor is selectively removed and replaced with another stack material. The stack precursor materials are replaced with stack materials to form the stack, which is present in the electronic device (e.g., an apparatus, a semiconductor device, a memory device).

The stack precursor materials are formulated to be in a solid phase as formed, and are formulated to be in a liquid phase or in a gas phase when removed. The stack precursor materials are converted (e.g., phase transformed) from the solid phase to the liquid phase or to the gas phase to selectively remove each of the stack precursor materials. One of the materials of the stack precursor is removed by increasing the temperature of the stack precursor above the melting point of that stack precursor material and below the melting point of the other stack precursor material. The stack precursor is subjected to the removal temperature (e.g., a first removal temperature) of the material, converting the solid phase material to the liquid phase or to the gas phase. After the removal, a conductive (e.g., electrically conductive) material is formed in place of the stack precursor material. The other stack precursor material is then removed by increasing the temperature of the stack precursor above the melting point of the other stack precursor material. The stack precursor is subjected to the removal temperature (e.g., a second removal temperature) of the other stack precursor material, converting the solid phase material to the liquid phase or to the gas phase. Alternatively, one or more of the stack precursor materials may decompose at the removal temperature $T_r$. The other stack precursor material is replaced by a dielectric material, forming a stack including alternating conductive materials and dielectric materials. Alternatively, the other material is replaced with air, forming a stack including alternating conductive materials and air gaps.

The stack including the alternating conductive materials and dielectric materials or the alternating conductive materials and air gaps is formed by a so-called "replacement" process because the materials of the stack precursor are removed and replaced with additional materials. The alternating conductive materials and dielectric materials or the alternating conductive materials and air gaps form a portion (e.g., a component) of a stack structure. One or more of the stack structures form a portion (e.g., a component) of an electronic device (e.g., an apparatus, a semiconductor device, a memory device). Depending on the electronic device to be formed, additional features are present in or adjacent to the stack structures.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device that includes stack materials, such as stacks of alternating conductive materials and dielectric materials or stacks of alternating conductive materials and air gaps.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "selectively removable" means and includes a material that exhibits a greater removal rate responsive to process conditions, such as exposure to radiation (e.g., heat), relative to another material exposed to the same process conditions. A material that is selectively removable relative to another material is substantially completely removable without removing substantially any of the another material.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "stack precursor" means and includes a structure including alternating stack precursor materials positioned vertically adjacent to one another and that are selectively removable and replaceable by additional materials. One or more of the stack precursor materials is sacrificial in that the material (e.g., a sacrificial stack material) is subsequently replaced with a different material.

As used herein, the term "stack precursor material" means and includes a material of the stack precursor that is in a solid phase under formation conditions and in a liquid phase or in a gas phase under removal conditions.

As used herein, the term "stack" means and includes a structure having alternating stack materials positioned vertically adjacent to one another.

As used herein, the term "stack material" means and includes a material formed in place of the stack precursor material and is present in the stack. The materials of the stacks include one or more conductive (e.g., electrically conductive) material and one or more insulative (e.g., electrically insulative) material.

As used herein, the term "stack structure" means and includes a structure including alternating stack materials and cell materials adjacent to the stack materials.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "thermally removable" means and includes a material that exhibits a greater removal rate responsive to exposure to heat relative to another material exposed to the same heat.

As used herein, the term "substrate" means and includes a material (e.g., a base material) or construction upon which additional materials are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As shown in the flowchart of FIG. 1, a first material (e.g., a first stack precursor material) is formed on a substrate (e.g., a base material) at a formation temperature $T_{f1}$ less than a melting point $T_1$ of the first material. A second material (e.g., a second stack precursor material) is formed on the first material at a formation temperature $T_{f2}$ less than a melting point $T_2$ of the second material and less than the melting point $T_1$ of the first material. The melting point $T_1$ of the first material is less than the melting point $T_2$ of the second material. The first material and the second material may be formed at a single formation temperature $T_f$ below the melting points $T_1$, $T_2$ or each of the first material and the second material may be formed at different formation temperatures $T_{f1}$, $T_{f2}$ below the respective melting points $T_1$, $T_2$. Forming alternating first materials and second materials is sequentially repeated until a stack precursor including alternating first and second materials is formed to a desired height. Since the first material and second material are formed at a temperature below their respective melting points, the first and second materials are formed on the base material as a solid (e.g., in a substantially solid phase).

A hardmask material is formed adjacent (e.g., over) the stack precursor of alternating first materials and second materials and the hardmask material is patterned. The hardmask material is formed at a temperature below the melting points $T_1$, $T_2$ of the first and second materials. The pattern in the hardmask material is transferred to the stack precursor materials by removing (e.g., etching) portions of the first material and the second material exposed through the patterned hardmask material to form an opening (e.g., a pillar opening, a memory hole) in the stack precursor. The first and second materials are patterned at a temperature below the melting points $T_1$, $T_2$. After removing the patterned hardmask material, a sacrificial material is formed in the pillar opening. The sacrificial material is formed at a temperature below the melting points $T_1$, $T_2$.

The first material and the second material may be a liquid (e.g., in a substantially liquid phase) or a gas (e.g., in a substantially gaseous phase) at a removal temperature $T_r$. The first material of the stack precursor is removed by increasing the temperature of the stack precursor to a removal temperature $T_{r1}$ above the melting point $T_1$ of the first material and below the melting point $T_2$ of the second material. The first material is a liquid or a gas at the removal temperature, enabling the first material to be removed and forming first spaces between the vertically adjacent portions of the second material. A conductive material is formed in the first spaces. The first material is substantially completely removed and the conductive material substantially completely fills the first spaces such that the conductive material has substantially the same dimensions as the dimensions at which the first material was formed. The temperature of the stack precursor may be increased to a removal temperature $T_{r2}$ above the melting point $T_2$ of the second material, enabling the second material to be removed and forming second spaces between the vertically adjacent conductive materials. The second material is a liquid or a gas at the removal temperature. A dielectric material is formed in the second spaces. The second material is substantially completely removed and the dielectric material substantially completely fills the second spaces such that the dielectric material has substantially the same dimensions as the dimensions at which the second material was formed. After removing the sacrificial material, cell materials are formed in the pillar opening to form an electronic device containing memory cells.

While embodiments herein describe the materials of the stack precursor as including two materials, more than two materials (e.g., three or more materials) may be present in the stack precursor as long as the stack precursor materials are selected to exhibit removal selectivity based on different melting points of the stack precursor materials. The two or more stack precursor materials may be selected to exhibit thermal selectivity during the fabrication process. In addition, the stack precursor may include different arrangements (e.g., configurations) of the stack precursor materials rather than alternating stack precursor materials.

Figure 2:
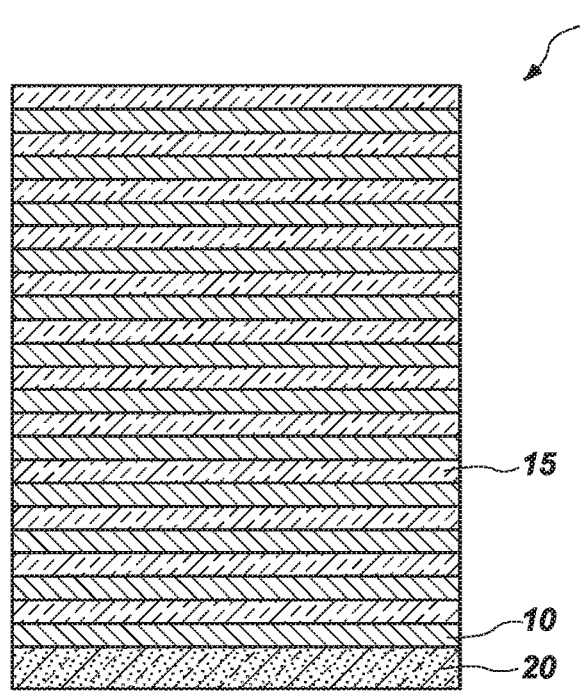
FIGS. 2-12 are cross-sectional views of electronic structures including stacks of alternating materials at various stages of forming the stacks according to embodiments of the disclosure.

A stack precursor 5 including alternating first materials 10 (e.g., first stack precursor materials) and second materials 15 (e.g., second stack precursor materials) is shown in FIG. 2. The stack precursor 5 is formed by alternately forming the first material 10 and the second material 15 over a base material 20. The stack precursor 5 may also be referred to as including one or more sacrificial stack materials, such as a first sacrificial stack material and a second sacrificial stack material. The process acts described herein are conducted using conventional semiconductor equipment. The process temperatures (e.g., formation temperature $T_f$, removal temperature $T_r$) described herein may be achieved using conventional semiconductor processing equipment, which are configured to maintain a temperature of a chuck upon which the stack precursor 5 is placed by ±5° C. or less. The first material 10 is formed on the base material 20 at the formation temperature $T_{f1}$, which is less than the melting point $T_1$ of the first material 10, and the second material 15 is formed on the first material 10 at the formation temperature $T_{f2}$, which is less than the melting point $T_2$ of the second material 15 and less than the melting point $T_1$ of the first material 10. Alternatively, the first material 10 and the second material 15 are formed at a single formation temperature $T_f$ that is less than the melting points $T_1$, $T_2$ of the first and second materials 10, 15. The first material 10 and the second material 15 are formed in a substantially solid phase at the formation temperature $T_f$, $T_{f1}$, $T_{f2}$. The first material 10 and the second material 15 are also thermally removable (e.g., thermally etchable) relative to one another.

The first material 10 may exhibit a lower melting point $T_1$ than the melting point $T_2$ of the second material 15. The difference in melting points between the first material 10 and the second material 15 may range between a difference of about 5° C. and a difference of about 150° C. By way of example only, the melting point $T_1$ of the first material 10 may be about 5° C. less than the melting point $T_2$ of the second material 15, the melting point $T_1$ of the first material 10 may be about 15° C. less than the melting point $T_2$ of the second material 15, the melting point $T_1$ of the first material 10 may be about 50° C. less than the melting point $T_2$ of the second material 15, or the melting point $T_1$ of the first material 10 may be about 100° C. less than the melting point $T_2$ of the second material 15. By selecting the materials of the first material 10 and the second material 15 to exhibit the difference between the melting points $T_1$, Ta, the first material 10 of the stack precursor 5 may be selectively thermally removable relative to the second material 15 and relative to other exposed materials of the stack precursor 5. The greater the difference between the melting points $T_1$, $T_2$ of the first and second materials 10, 15, the more easily and more completely the first material 10 may be thermally removed compared to the second material 15 and to exposed materials of the stack precursor 5. By appropriately choosing the first and second materials 10, 15, thermal selectivity may be used to selectively remove the first material 10 and the second material 15.

Figure 3:
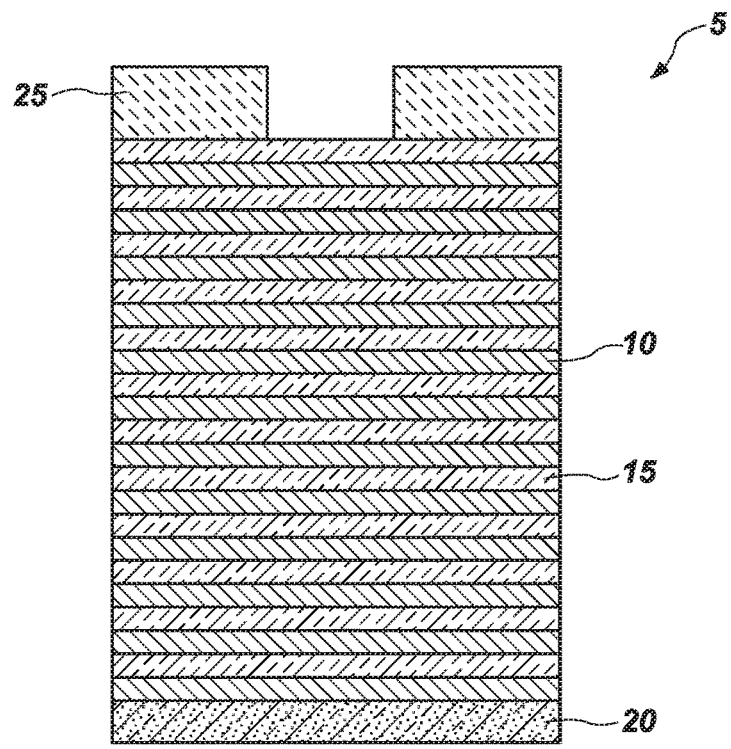

In addition to being compatible with the base material 20, the first material 10 and the second material 15 are compatible with deposition conditions used to form the first and second materials 10, 15, with removal process conditions used to remove portions of the first and second materials 10, 15, with deposition process conditions used to form a hardmask material, and with removal process conditions used to form a patterned hardmask material 25 (see FIG. 3). The first and second materials 10, 15 may form distinct layers that do not diffuse (e.g., do not interdiffuse) with one another. By forming the first material 10 and the second material 15 at a temperature below their melting points, interdiffusion of the first material 10 and the second material 15 is minimized and the formation of discrete layers is maximized. With bonding occurring between the first and second materials 10, 15, substantially no intermixing occurs between the first and second materials 10, 15.

The first material 10 and the second material 15 may be an organic compound (e.g., an organic acid, an alcohol, a polymer), an inorganic compound, an ionic liquid, or a combination thereof, as long as the materials of the first material 10 and the second material 15 are selectively removable relative to one another based on differences between their melting points. By way of example only, the organic acid may be acetic acid (melting point 16.6° C.), lactic acid (melting point 16.8° C.), or formic acid (melting point 8.4° C.). By way of example only, the alcohol may be methanol (melting point −97.6° C.) or ethanol (melting point −114.1° C.). Other organic compounds, such as naphthalene (melting point 80.3° C.), may also be used. By way of example only, the inorganic compound may be carbon dioxide ($CO_2$) (melting point −56.6° C.), water ($H_2O$) (melting point 0° C.), nitrogen ($N_2$) (melting point −210° C.), or nitrous oxide ($N_2O$) (melting point −90.86° C.). By way of example only, the ionic liquid may include, but is not limited to, 1-ethyl-3-methylimidazolium ethylsulfate (melting point less than −20° C.).

By way of example only, the polymer may be a photosensitive polymer or a thermally sensitive polymer, such as a photosensitive resist or a thermally sensitive resist. The photosensitive polymer or the thermally sensitive polymer may, alternatively, decompose at the removal temperature $T_r$. Since resist materials are typically in a liquid phase at temperatures used in semiconductor processing, the resist material may be formed by conventional techniques and the solvent removed to form the resist material as a solid on the base material 20. The polymer may include one or more functional groups to tailor the melting point of the polymer and one or more functional groups that are selected for coupling with radiation used to pattern the first and second materials 10, 15.

In some embodiments, the first material 10 is water and the second material 15 is acetic acid. In such an embodiment, the water and acetic acid may alternately be formed on the base material 20 at a temperature of less than about −10° C. In other embodiments, the first material 10 is a resist having a melting point of about 50° C. and the second material is a resist having a melting point of about 75° C. In yet other embodiments, the first material 10 is a photosensitive resist and the second material 15 is a thermally sensitive resist and the two resists have a melting point difference of greater than or equal to about 5° C.

The first material 10 and the second material 15 may be formed on the base material 20 by conventional techniques including, but not limited to, spin coating, blanket coating, CVD, or PVD. If the first material 10 and the second material 15 are resist materials, each of the first material 10 and the second material 15 may initially be formed on the base material 20 in a liquid phase that includes a solvent. The solvent may subsequently be removed (e.g., evaporated) to form the first material 10 and the second material 15 as a solid.

Each of the alternating first materials 10 and the second materials 15 may be formed to a thickness that depends on desired electrical properties of the electronic device ultimately to be formed. The thicknesses of the first material 10 and the second material 15 may depend on desired thicknesses of, for example, dielectric materials and conductive materials ultimately to be formed in place of the first material 10 and the second material 15. If the first materials 10 are replaced by the conductive material, the thickness at which the first materials 10 are formed may correspond to a desired gate length of the electronic device, where the conductive material is configured as a gate of the electronic device. If the second materials 15 are replaced by the dielectric material, the thickness at which the second materials 15 are formed may be sufficient to isolate (e.g., electrically isolate) conductive components of the electronic device from one another with the dielectric material. The first material 10 and the second material 15 may be formed at the same thickness or at different thicknesses relative to one another. The alternating formation of the first material 10 and the second material 15 may be repeated until the stack precursor 5 is formed to a desired height. The stack precursor 5 includes multiple tiers, with each tier including a first material 10 and a second material adjacent to (e.g., vertically adjacent to) the first material 10.

As shown in FIG. 3, a hardmask material is formed adjacent (e.g., over) the stack precursor 5 and patterned to form a patterned hardmask material 25. The hardmask material is formed at a temperature below the melting points $T_1$, $T_2$ of the first material 10 and the second material 15. The hardmask material may be formed by conventional techniques including, but not limited to, spin coating, blanket coating, CVD, or PVD. The hardmask material of the stack precursor 5 may be an insulative material, a semiconductive material, or a metal material that is selectively removable (e.g., selectively etchable) relative to the first material 10 and the second material. The hardmask material may also be compatible with the process conditions, such as the process temperatures, used to form and pattern the hardmask material and the process conditions, such as the process temperatures, used to pattern the first and second materials 10, 15. The hardmask material may include, but is not limited to, silicon, silicon oxide, silicon nitride, tungsten, tantalum, titanium, or a photoresist. The hardmask material may be formed to a thickness sufficient to protect the materials of the stack precursor 5 during subsequently-conducted process acts.

Portions of the hardmask material are removed (e.g., etched) to form the patterned hardmask material 25 that includes an opening. The hardmask material may be patterned at a temperature lower than the melting points $T_1$, $T_2$ of the first material 10 and the second material 15. While a single opening in the patterned hardmask material 25 is shown in FIG. 3 for simplicity, multiple openings are present in the patterned hardmask material 25.

Figure 4:
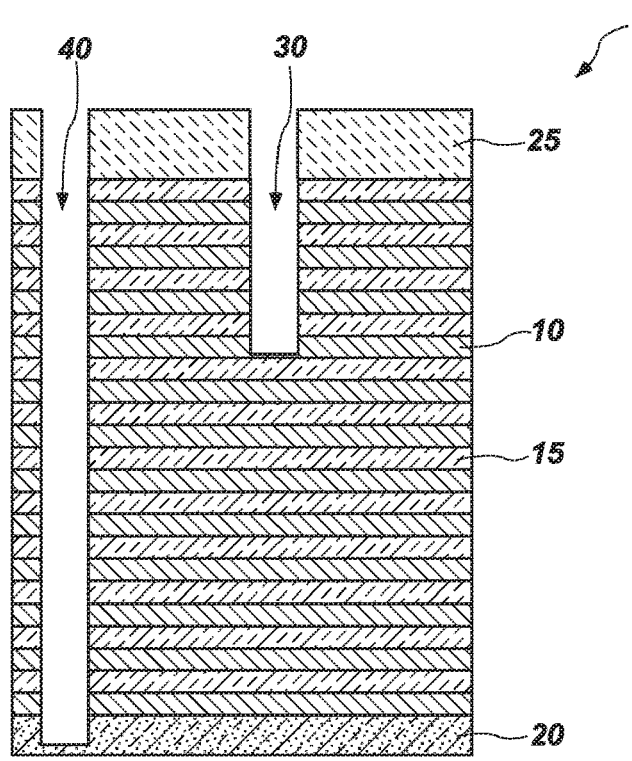
Figure 5:
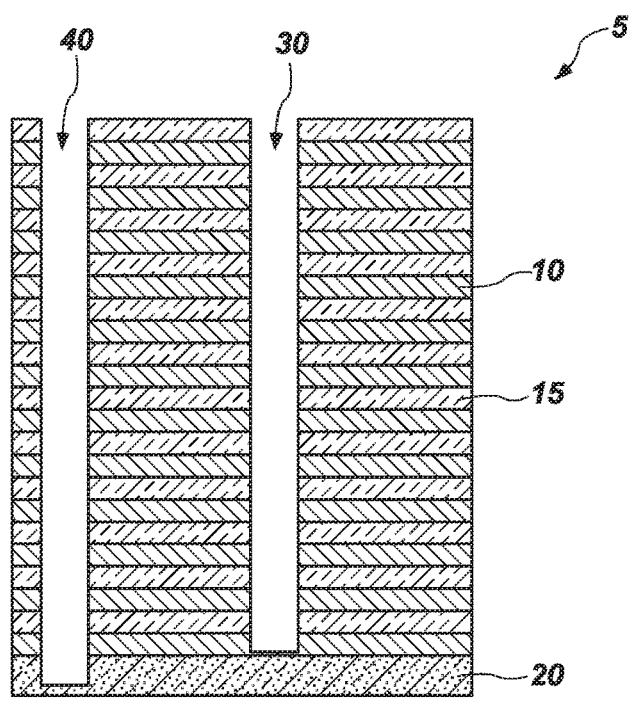

The hardmask material may be patterned by conventional techniques and the patterned hardmask material 25 used as a mask to remove underlying portions of the first material 10 and the second material 15. As shown in FIGS. 4 and 5, portions of the first material 10 and the second material 15 underlying the opening in the patterned hardmask material 25 are removed (e.g., etched) to form a pillar opening 30 in the stack precursor 5. The pattern of the patterned hardmask material 25 is, therefore, transferred into the first and second materials 10, 15. The pillar opening 30 may exhibit a critical dimension (CD) of less than about 150 nm, such as between about 50 nm and about 150 nm, between about 80 nm and about 120 nm, between about 70 nm and about 110 nm, or between about 60 nm and about 100 nm. The pillar opening 30 may exhibit a high aspect ratio, such as having an aspect ratio (i.e., a ratio of width to depth) of greater than or equal to about 5:1, such as from about 5:1 to about 100:1, from about 5:1 to about 50:1, from about 10:1 to about 40:1, from about 10:1 to about 30:1, from about 10:1 to about 20:1, from about 20:1 to about 50:1, from about 20:1 to about 40:1, or from about 20:1 to about 30:1. The pillar opening 30 is formed at a temperature lower than the melting points $T_1$, $T_2$ of the first material 10 and the second material 15. For simplicity, FIGS. 4 and 5 show a single pillar opening 30. However, multiple pillar openings 30 may be present in the stack precursor 5 depending on the number of openings present in the patterned hardmask material 25.

The materials of the stack precursor 5 are removed by exposing the first material 10 and the second material 15 to a thermal process, such as a non-reactive and directional, thermal etch process. The thermal etch process produces localized radiation (e.g., light, heat) at wavelengths less than or equal to wavelengths in the ultraviolet (UV) region, x-ray region, or gamma-ray region of the electromagnetic spectrum. Substantially no reactive species are produced by the thermal etch process and high temperature ions generated by the thermal etch process are used to remove the first material 10 and the second material 15 locally. The light and/or heat produced by the thermal etch process functions as an etch front to locally remove the portions of the first material 10 and the second material 15 using the patterned hardmask material 25 as a mask. The portions of the first material 10 and the second material 15 underlying the opening in the patterned hardmask material 25 are removed, starting at a top surface of the stack precursor 5, extending to a bottom surface of the stack precursor 5, and exposing a bottommost first material 10. The localized radiation provides consistent removal (e.g., consistent etching) of the first material 10 and the second material 15 to form the pillar opening 30 exhibiting substantially vertical sidewalls. By way of example only, the thermal etch process may be a plasma dry etch process including an inert gas, such as argon. The high temperature ions of the thermal process impart thermal energy to the portions of the first material 10 and the second material 15 exposed through the patterned hardmask material 25 but substantially no reactive species. Alternatively, a laser may be used to remove the first material 10 and the second material 15 as long as a spot size of the laser is less than the size of the pillar opening 30 to be formed. Dimensions of the pillar opening 30 may be sufficient to form features, such as high aspect ratio features, in the pillar opening 30.

Without being bound by any theory, it is believed that the radiation from the thermal etch process couples to the bonds between the first and second materials 10, 15. The radiation is absorbed by the bonds, causing the exposed portions of the first and second materials 10, 15 to be removed (e.g., volatilized, evaporated, vaporized, sublimated). To increase the extent of coupling between the radiation and the first and second materials 10, 15, functional groups of the first and second materials 10, 15 may be selected for coupling with the radiation. By way of example only, the functional groups may be hydroxyl (—OH) functional groups. The thermal etch process generates a small amount of radiation (e.g., heat, light), which is localized below the opening in the patterned hardmask material 25 and does not substantially increase the temperature of a bulk volume of other portions of the first material 10 and the second material 15. Only the portions of the first material 10 and the second material 15 proximal to the opening in the patterned hardmask material 25 are, therefore, removed. The high directionality of the thermal etch process forms the pillar opening 30 in the desired location of the stack precursor 5 without removing other portions of the first material 10 and second material 15. Therefore, the pillar opening 30 is formed at desired dimensions without undesirably increasing the CD of the pillar opening 30. The thermal etch process may be conducted under vacuum conditions to maximize the directionality of the thermal etch process and to thermodynamically drive the etch process by removing volatile species from a tool containing the stack precursor 5. The patterned hardmask material 25 is subsequently removed by conventional techniques.

While FIGS. 3 and 4 illustrate the patterned hardmask material 25 and the use of the patterned hardmask material 25 to etch the stack precursor 5, the pillar opening 30 in the stack precursor 5 may alternatively be formed using a reticle (not shown) having a desired pattern. The reticle may be positioned over the stack precursor 5 and the pillar opening 30 formed through the first materials 10 and the second materials 15 by conventional techniques. The pillar opening 30, therefore, may be directly formed without using the patterned hardmask material 25 as a mask. In such an instance, the pillar opening 30 is directly formed by removing the portions of the first materials 10 and the second materials 15 as shown between the stack precursor 5 of FIG. 2 and the stack precursor 5 of FIG. 5. As discussed below, a slit 40 is also formed in the stack precursor 5.

Figure 6:
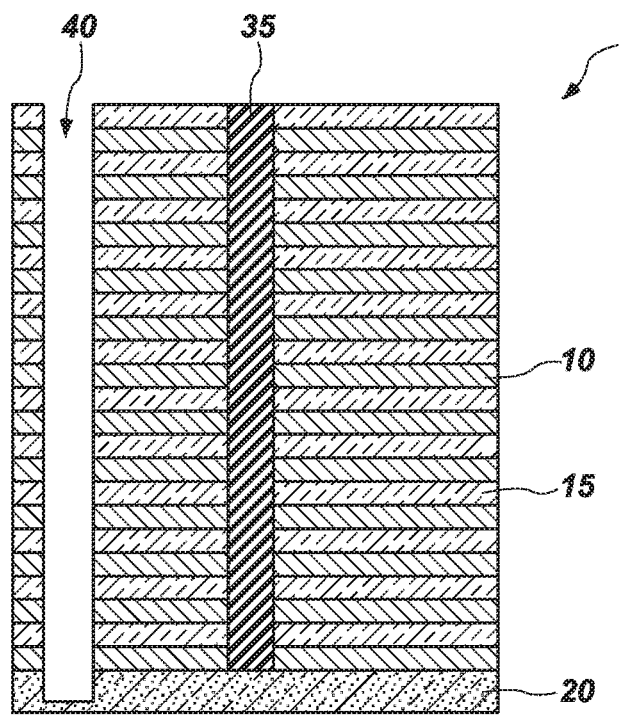

A sacrificial material 35 is formed in the pillar opening 30, as shown in FIG. 6. The sacrificial material 35 is formed at a temperature lower than the melting points $T_1$, $T_2$ of the first material 10 and the second material 15. The sacrificial material 35 may be selectively removable relative to exposed materials of a stack 65 (see FIGS. 10 and 11). The sacrificial material 35 may be an electrically insulative material, such as a dielectric material, or other selectively removable material. The sacrificial material 35 may include, but is not limited to, silicon dioxide, silicon nitride, silicon oxynitride, silicon oxycarbide, a spin-on dielectric material (SOD), BPSG, BSG, an air gap, another dielectric material, or resist material. The sacrificial material 35 may provide mechanical support and integrity to the stack precursor 5 and the stack 65 during the replacement process of removing and replacing the materials of the stack precursor 5. The sacrificial material 35 may substantially completely fill the pillar opening 30 and any excess sacrificial material 35 may be removed from an uppermost surface of the stack precursor 5.

In addition to the pillar opening 30, a slit 40 is formed in the stack precursor 5 before, after, or simultaneously with the formation of the pillar opening 30. The slit 40 is formed by conventional techniques and may extend through the stack precursor 5 and into the base material 20. The slit 40 is formed by removing portions of the first material 10 and second material 15 in a desired location. The slit 40 is formed at a temperature lower than the melting points $T_1$, $T_2$ of the first material 10 and the second material 15. As described in detail below, the slit 40 is used during subsequent process acts to remove and replace the first material 10 and the second material 15 with additional materials, such as a conductive material and a dielectric material, respectively. While the slit 40 and its formation is shown in FIGS. 4-11, the slit 40 may be formed before forming the patterned hardmask material 25, after forming the patterned hardmask material 25 and before forming the pillar opening 30, after forming the pillar opening 30, or after forming the sacrificial material 35 in the pillar opening 30. By way of example only, the slit 40 and the pillar opening 30 may be formed substantially simultaneously, the sacrificial material 35 formed in the slit 40 and the pillar opening 30, and the sacrificial material 35 removed from the slit 40 without substantially removing the sacrificial material 35 from the pillar opening 30.

During the process acts described above in relation to FIGS. 1-6, the temperature of the chuck upon which the stack precursor 5 is located is maintained below the melting points $T_1$, $T_2$ of the first material 10 and the second material 15. Therefore, the first material 10 and the second material 15 are maintained in their respective solid phases during the process acts described above. Different temperatures may be used for the individual process acts as long as the temperature of the chuck upon which the stack precursor 5 is located remains below the melting points $T_1$, $T_2$ of the first material 10 and the second material 15.

Figure 7:
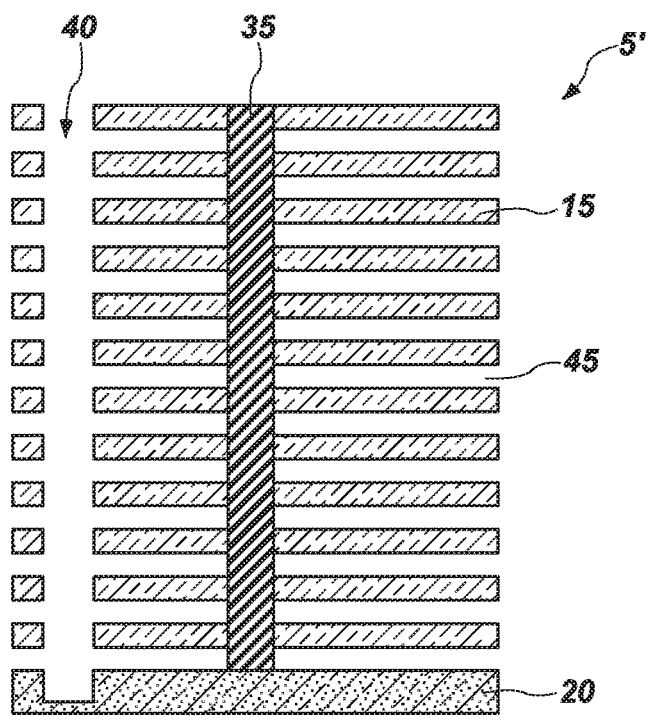

As shown in FIG. 7, the first material 10 is selectively removed by increasing the temperature of an environment (e.g., a process environment, an environment surrounding a chuck on which the stack precursor 5 is placed, a chamber) to which the stack precursor 5 is exposed, forming a stack precursor 5'. The chamber of the conventional semiconductor equipment, in which the chuck is contained, may be used to increase the temperature of the chuck. Conventional semiconductor equipment are configured to achieve temperature differences of ±5° C. at a temperature range between about −250° C. and about 1075° C. The conventional semiconductor equipment used to conduct the process acts described herein are configured to achieve temperatures below about 0° C., temperatures between about 0° C. and about 100° C., and greater than about 100° C. Other process conditions, such as a pressure within the chamber, may be adjusted to increase or decrease a rate of removing the first material 10 and the second material 15. By way of example only, the pressure within the chamber may be increased to decrease the removal rate or the pressure within the chamber may be decreased to increase the removal rate.

Since the melting point $T_1$ of the first material 10 is less than the melting point $T_2$ of the second material 15, the first material 10 may be selectively removed relative to the second material 15 by increasing the temperature of the environment surrounding the stack precursor 5 to the removal temperature $T_{r1}$, which is greater than the melting point $T_1$ of the first material 10 and less than the melting point $T_2$ of the second material 15. The first material 10 is also selectively removed relative to the base material 20 and the sacrificial material 35. At the removal temperature $T_{r1}$, the first material 10 transitions into a liquid state or into a gaseous state and is removed through the slit 40, forming first spaces 45 between vertically adjacent second materials 15. If the first material 10 is a liquid at the removal temperature $T_{r1}$, the liquid first material 10 may be removed by conventional liquid removal processes, such as aspirating, spinning, or otherwise removing the liquid. If the first material 10 is a gas at the removal temperature $T_{r1}$, the gaseous first material 10 may be removed by conventional gaseous removal processes, such as volatilizing, evaporating, vaporizing, sublimating, or otherwise removing the gas. The first spaces 45 exhibit dimensions substantially similar to the dimensions of the first material 10 since substantially all of the first material 10 is removed following the increase in temperature.

Figure 8:
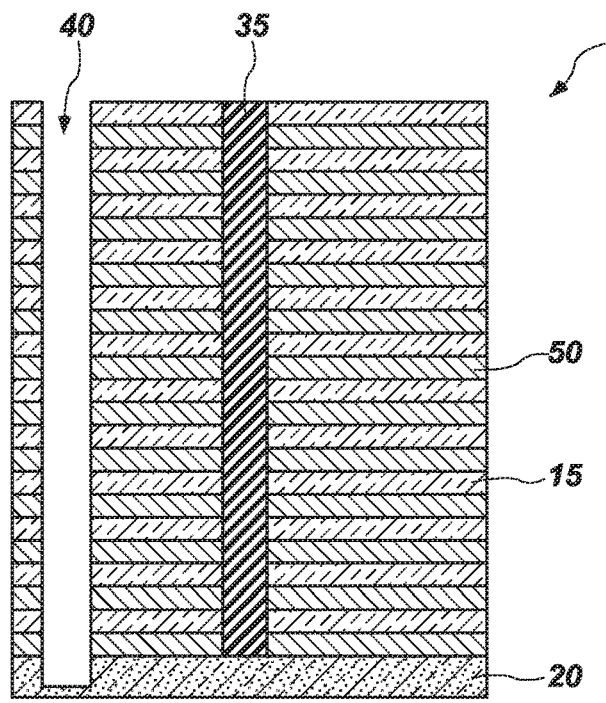

A conductive material 50 is formed in the first spaces 45, as shown in FIG. 8, through the slit 40. The conductive material 50 is formed at a temperature below the melting point $T_2$ of the second material 15. Other process conditions for forming the conductive material 50 are compatible with the second material 15 and do not substantially affect the properties of the second material 15. The conductive material 50 may substantially completely fill the first spaces 45, which are defined by remaining portions of the second material 15. The conductive material 50 is, therefore, formed in locations where the first material 10 was previously located and replaces the first material 10. The conductive material 50 exhibits substantially the same dimensions as the dimensions at which the first material 10 was formed. The conductive material 50 may be formed in the first spaces 45 by conventional techniques. The conductive material 50 may include an electrically conductive material including, but not limited to, tungsten, aluminum, copper, titanium, tantalum, platinum, alloys thereof, heavily doped semiconductor material, polysilicon, a conductive silicide, a conductive nitride, a conductive carbon, a conductive carbide, or combinations thereof. In some embodiments, the conductive material 50 is tungsten. The conductive material 50 may, for example, be configured as an access line, a word line, a contact, a digit line, a bit line, etc., of an electronic device containing the stack 65. The conductive material 50 may alternatively be configured as an electrode. A portion of the conductive material 50 may be removed, recessing the conductive material 50 to prevent shorting between neighboring conductive materials. By way of example only, the conductive material 50 may be laterally recessed adjacent to the slit 40 to form discrete conductive structures, such as wordlines.

Figure 9:
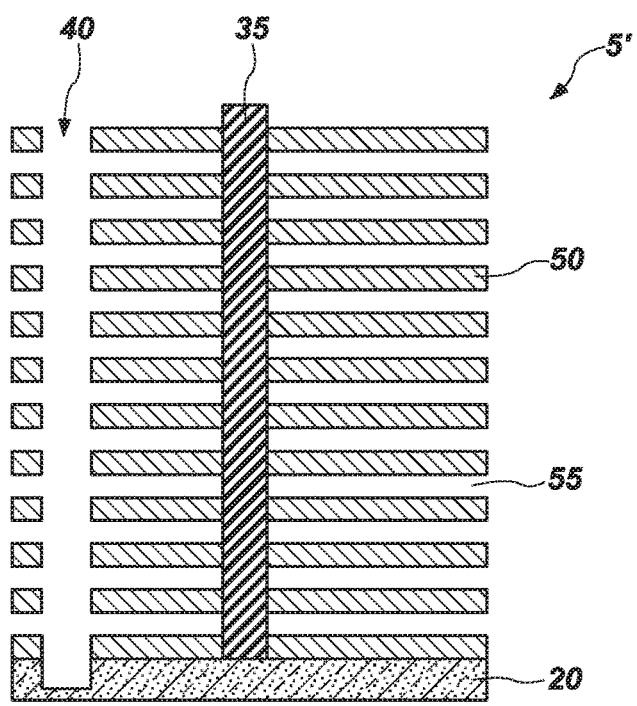

As shown in FIG. 9, the second material 15 may be selectively removed by increasing the temperature of the environment to which the stack precursor 5' is exposed to a temperature above the melting point $T_2$ of the second material 15. The second material 15 may be removed by increasing the temperature of the chuck to a removal temperature $T_{r2}$ greater than the melting point $T_2$. The second material 15 is selectively removed relative to the conductive material 50, the base material 20, and the sacrificial material 35. At the removal temperature $T_{r2}$, the second material 15 transitions into a liquid state or into a gaseous state and is removed through the slit 40, forming second spaces 55 between vertically adjacent conductive materials 50. The second material 15 may be removed by conventional liquid or gaseous removal processes, as discussed above for the removal of the first material 10. The second spaces 55 exhibit dimensions substantially similar to the dimensions of the second material 15 since substantially all of the second material 15 is removed following its transition to the liquid state or to the gaseous state.

During the removal of one or more of the first material 10 and the second material 15, an in situ polymer may, optionally, be formed on sidewalls of the slit 40. The in situ polymer may be formed substantially simultaneously with the removal of one or more of the first material 10 and the second material 15. The in situ polymer may be formed by introducing polymerizing species into the chamber during the thermal etch process used to remove the first material 10 and the second material 15. The in situ polymer formed on the sidewalls of the slit 40 may prevent scattering of radiation during the thermal etch process.

Figure 10:
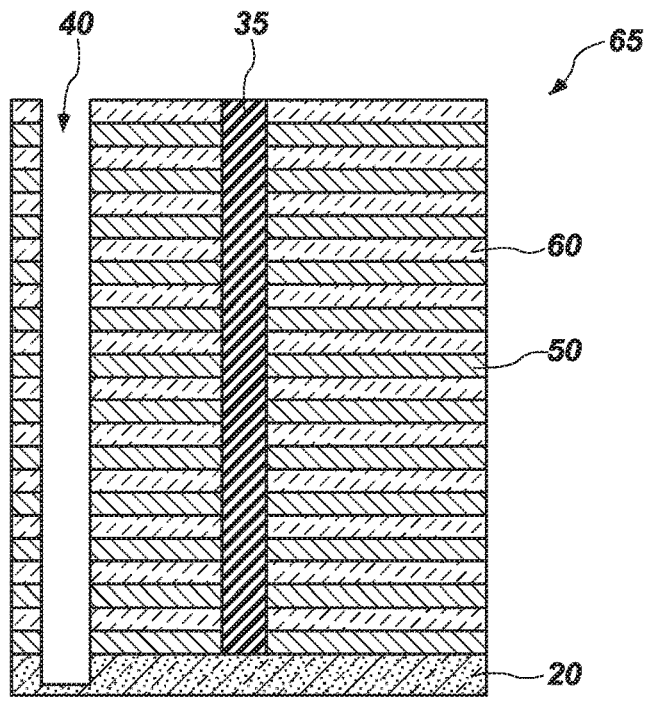

A dielectric material 60 is formed in the second spaces 55, as shown in FIG. 10. The dielectric material 60 may substantially completely fill the second spaces 55, which are defined by surfaces of the conductive material 50, to form the stack 65. The dielectric material 60 is, therefore, formed in locations where the second material 15 was previously located and replaces the second material 15. The dielectric material 60 exhibits substantially the same dimensions as the dimensions at which the second material 15 was formed. The dielectric material 60 may be formed in the second spaces 55 by conventional techniques. The dielectric material 60 may include an electrically insulative material including, but not limited to, a silicon oxide (e.g., silicon dioxide ($SiO_2$)), silicon nitride, phosphosilicate glass, borosilicate glass, borophosphosilicate glass, fluorosilicate glass, or a combination thereof. In some embodiments, the dielectric material 60 is silicon oxide. The dielectric material 60 may, for example, be configured to electrically isolate the conductive materials 50 of an electronic device containing the stack 65. The dielectric material 60 may be substantially coplanar with a top surface of the sacrificial material 35. The stack 65 includes multiple tiers, with each tier including a conductive material 50 and an adjacent (e.g., vertically adjacent) dielectric material 60.

Alternatively, the second spaces 55 may include remain empty (e.g., unfilled), forming air gaps (not shown) between the vertically adjacent conductive materials 50. While embodiments herein describe the gaps as including air, other inert gases having insulative properties may be present in the gaps. The air gaps may be present depending on desired performance properties, such as capacitance, of the electronic device containing the stack 65. After removing the second material 15, the second spaces 55 may be sealed by conventional techniques to form the air gaps. The air or other gas may provide improved insulative properties to the stack 65.

Figure 11:
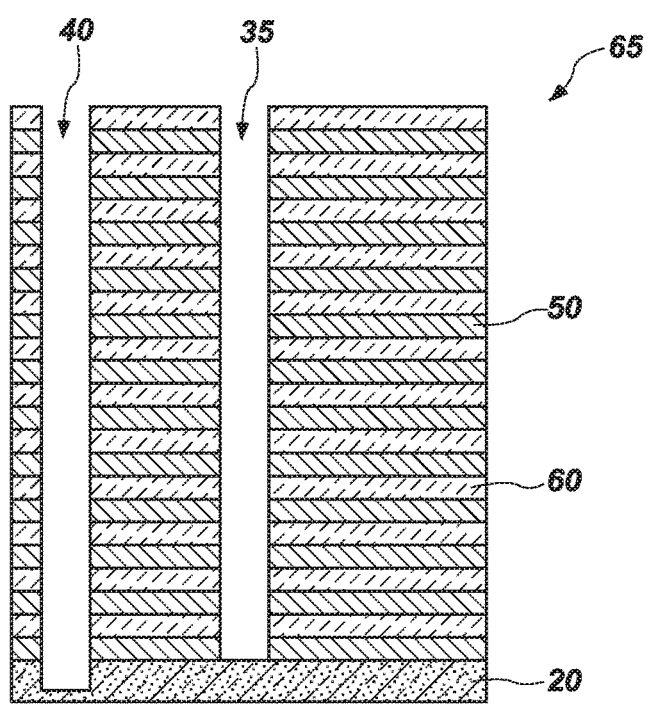
Figure 12:
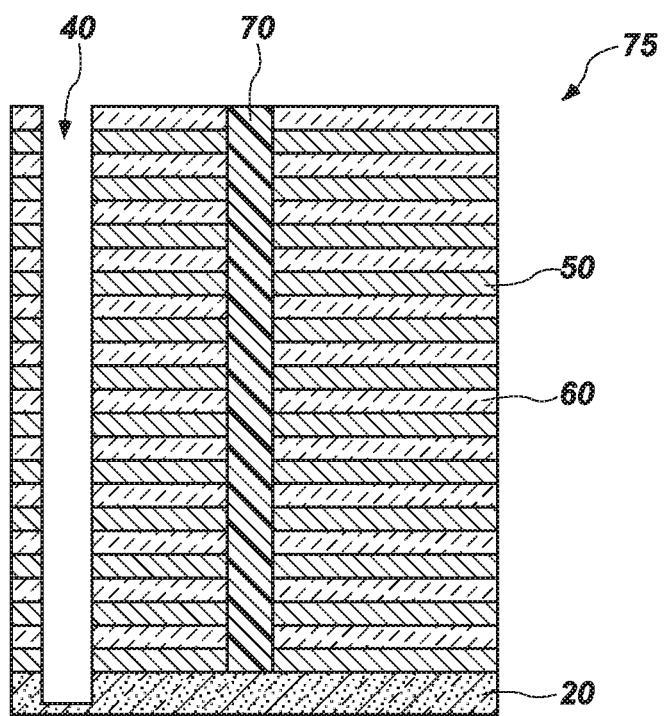

The sacrificial material 35 is removed from the pillar opening 30 as shown in FIG. 11. The sacrificial material 35 is selectively removed without substantially affecting the conductive material 50, the dielectric material 60, or the air gaps. The sacrificial material 35 is removed by conventional techniques. As shown in FIG. 12, cell materials 70 are formed in the pillar opening 30 to form memory cells in the stack structure 75. The stack structure 75 includes the alternating dielectric materials 60 and conductive materials 50 and the cell materials 70, while the stack 65 includes the alternating dielectric materials 60 and conductive materials 50 and the sacrificial material 35. The cell materials 70 may, for example, include a dielectric barrier material (e.g., aluminum oxide, hafnium oxide, zirconium oxide) adjacent the conductive materials 50, a charge blocking material (e.g., silicon dioxide, aluminum oxide, hafnium oxide, zirconium oxide) adjacent the dielectric barrier material, a charge storage material (e.g., silicon nitride, silicon oxynitride, conductive nanodots) adjacent the charge blocking material, a tunneling material (e.g., silicon dioxide, aluminum oxide, hafnium oxide, zirconium oxide) adjacent the charge storage material, and a channel material adjacent the tunneling material. In FIG. 12, the cell materials 70 are shown as a single material for simplicity, although it is understood that multiple materials are present. The cell materials 70 may be formed at high temperatures, such as greater than about 400° C., depending on the materials selected.

The features in the pillar opening 30 may be high aspect ratio (HAR) features having an aspect ratio (i.e., a ratio of width to depth) of greater than or equal to about 5:1, such as from about 5:1 to about 100:1, from about 5:1 to about 50:1, from about 10:1 to about 40:1, from about 10:1 to about 30:1, from about 10:1 to about 20:1, from about 20:1 to about 50:1, from about 20:1 to about 40:1, or from about 20:1 to about 30:1.

While the thermal budget is high for forming the cell materials 70 after conducting the replacement process, the cell materials 70 may, alternatively, be formed after forming the pillar opening 30 and before conducting the replacement process for the first and second materials 10, 15, such as at the process stage shown in FIG. 5. The cell materials 70 and the first and second materials 10, 15 may be selected to be compatible with process conditions of such an embodiment. For example, the first and second materials 10, 15 are selected to exhibit melting points $T_1$, $T_2$ that are higher than the formation temperature of the cell materials 70. The cell materials 70 are formed in the pillar opening 30 at the formation temperature, which is below the melting points $T_1$, $T_2$ to prevent premature phase transformation of the first and second materials 10, 15. The cell materials 70 are formed in the pillar opening 30 instead of the sacrificial material 35, followed by conducting the removal and replacement process for the first and second materials 10, 15 as described above.

The slit 40 may be filled with another conductive material (not shown) to electrically connect the conductive materials 50 of the stack structure 75 to other conductive components (not shown) of the electronic device. The alternating dielectric materials 60 and conductive materials 50 and the cell materials 70 form the stack structure 75 exhibiting desired dimensions. The stack structure 75 may be further processed to form the electronic device containing the stack structure 75. Additional process acts for forming the electronic device including the stack structures 75 and the memory cells are conventional.

By way of example only, the electronic device including one or more stack structures 75 formed according to embodiments of the disclosure may be any 3D electronic device, such as a 3D NAND device, a Flash memory device, a crosspoint device, or other memory device where the stack structures 75 are desired.

To reduce the complexity of forming stack structures 75 according to embodiments of the disclosure, the materials selected as the first material 10 and the second material 15 may exhibit melting points that enable the process conditions, such as the formation temperatures ($T_f$) and the removal temperatures ($T_r$), to be within a range of from about 0° C. to about 150° C., such as around room temperature (between about 20° C. to about 25° C.). Therefore, the methods according to embodiments of the disclosure may be conducted without applying significant additional cooling or heating. Since the process conditions depend on the materials selected as the first material 10 and the second material 15, selecting the first material 10 and the second material 15 to exhibit melting points within a range of from about 5° C. to about 100° C. enables the stack structures 75 to be formed without utilizing significant, additional cooling or heating of the stack structures 75. By way of example only, the first material 10 and the second material 15 may exhibit melting points of between about 5° C. and about 25° C., such as between about 5° C. and about 20° C., between about 5° C. and about 15° C., between about 5° C. and about 10° C., or between about 10° C. and about 15° C. If, for example, the melting points of the first material 10 and the second material 15 are about 10° C. and about 15° C., respectively, the formation temperature $T_f$ of the first material 10 and the second material 15 may be about 0° C., and the removal temperatures $T_r$ may be about 20° C. and about 25° C., respectively. Similarly, if, for example, the melting points of the first material 10 and the second material 15 are about 20° C. and about 25° C., respectively, the formation temperature $T_f$ of the first material 10 and the second material 15 may be about 15° C., and the removal temperatures $T_r$ may be about 30° C. and about 35° C., respectively. The first material 10 and the second material 15 may be formed and removed with substantially no cooling or heating of the stack structures 75 utilized.

If higher melting point materials are utilized, the formation temperature $T_f$ of the first material 10 and the second material 15 may be about room temperature and no additional cooling of the stack structures 75 may be utilized. If, for example, the melting points of the first material 10 and the second material 15 are about 80° C. and about 130° C., respectively, the formation temperature $T_f$ of the first material 10 and the second material 15 may be about room temperature and the removal temperatures $T_r$ may be about 85° C. and about 135° C., respectively. The first material 10 and the second material 15 may be formed and removed with substantially no cooling of the stack structures 75 utilized.

Forming the stack structures 75 according to embodiments of the disclosure may reduce the complexity and associated cost of forming the pillar openings 30 in the precursor stack materials and of forming features, such as cell materials, in the pillar openings 30 compared to conventional replacement gate processes. Since the stack precursor materials are easily removed by selecting the removal temperatures ($T_r$) to be above the melting points of the stack precursor materials, the stack structures 75 having the desired dimensions may be easily formed by initially forming the stack precursor materials at the desired dimensions. Since the pillar openings 30 of the stack precursors 5 are formed by a thermal etch process that evaporates (e.g., vaporizes) the stack precursor materials by the application of localized heat, the pillar openings 30 are easily formed through the stack precursor 5 including the large number of tiers. Therefore, the pillar openings 30 may be formed through a single deck having the large number of tiers rather than forming multiple decks with each deck having fewer tiers. Utilizing the thermal etch process to form the pillar openings 30 also reduces the complexity of the overall process since only ions are generated and the ions have a high directionality relative to reactive species generated in the conventional replacement gate processes. Forming the pillar openings 30 through the single deck also reduces the number of process acts that are conducted, reducing the complexity and amount of time of the overall process. The formation of the single deck with the large number of tiers is advantageous because alignment issues associated with aligning the multiple decks are eliminated. Therefore, the methods according to embodiments of the disclosure form high aspect ratio pillar openings 30 and high aspect ratio features in the pillar openings 30, while being cheaper, faster, and having reduced alignment issues than conventional replacement gate processes.

While the embodiments described and illustrated herein replace both the first materials 10 and the second materials 15, the stack precursor 5 may include alternating first materials 10 and dielectric materials 60 or alternating second materials 15 and conductive materials 50. The first materials 10 may exhibit a lower melting point than the dielectric materials 60, or the second materials 15 may exhibit a lower melting point than the conductive materials 50. The first materials 10 or the second materials 15 may be removed by increasing the process temperature above the melting point of the respective material, as described above. The respective conductive materials 50 or dielectric materials 60 are formed in the resulting spaces, forming the stack structure 75. Embodiments including the air gaps may be similarly formed, starting with alternating second materials 15 and conductive materials 50, except that the second materials 15 would not be replaced by the dielectric materials 60. Rather, the second spaces 55 would include air or another gas having insulative properties.

Accordingly, a method of forming an electronic device is disclosed. The method comprises forming a stack precursor comprising alternating first materials and second materials on a base material. The first materials and the second materials exhibit different melting points. A portion of the alternating first materials and second materials is removed to form a pillar opening through the alternating first materials and second materials. A sacrificial material is formed in the pillar opening. The first materials are removed to form first spaces between the second materials, the first materials formulated to be in a liquid phase or in a gas phase at a first removal temperature. A conductive material is formed in the first spaces. The second materials are removed to form second spaces between the conductive materials, the second materials formulated to be in a liquid phase or in a gas phase at a second removal temperature. A dielectric material is formed in the second spaces. The sacrificial material is removed from the pillar opening and cell materials are formed in the pillar opening.

Accordingly, another method of forming an electronic device is disclosed. The method comprises forming alternating first materials and second materials on a base material. The first materials and the second materials are formulated to be removable at different temperatures and exhibit melting points differing from one another by between about 5° C. and about 150° C. A portion of the alternating first materials and second materials is exposed to a thermal process to form a pillar opening through the alternating first materials and second materials. A sacrificial material is formed in the pillar opening. The first materials are exposed to a temperature above a melting point of the first materials and below a melting point of the second materials to remove the first materials and to form first spaces. A conductive material is formed in the first spaces. The second materials are exposed to a temperature above a melting point of the second materials to remove the second materials and to form second spaces. A dielectric material is formed in the second spaces. The sacrificial material is removed from the pillar opening and cell materials are formed in the pillar opening.

Accordingly, yet another method of forming an electronic device is disclosed. The method comprises forming alternating first materials and second materials on a base material. The first materials and second materials are formed in a solid phase and are formulated to be removable at different temperatures. A portion of the alternating first materials and second materials is exposed to a thermal etch process to form a pillar opening through the alternating first materials and second materials. A sacrificial material is formed in the pillar opening. The first materials are removed to form first spaces between the second materials and a conductive material is formed in the first spaces. The second materials are removed to form second spaces between the conductive materials and a dielectric material is formed in the second spaces. The sacrificial material is removed from the pillar opening and cell materials are formed in the pillar opening.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming an electronic device comprising:
    forming a stack precursor comprising alternating first materials and second materials on a base material, the first materials and the second materials exhibiting different melting points;
    removing a portion of the alternating first materials and second materials to form a pillar opening through the alternating first materials and second materials;
    forming a sacrificial material in the pillar opening;
    removing the first materials to form first spaces between the second materials, the first materials formulated to be in a liquid phase or in a gas phase at a first removal temperature;
    forming a conductive material in the first spaces;
    removing the second materials to form second spaces between the conductive materials, the second materials formulated to be in a liquid phase or in a gas phase at a second removal temperature;
    forming a dielectric material in the second spaces;
    removing the sacrificial material from the pillar opening; and
    forming cell materials in the pillar opening.

2. The method of claim 1, wherein forming a stack precursor comprising alternating first materials and second materials comprises forming the alternating first materials and second materials formulated to be removable at different temperatures.

3. The method of claim 1, wherein forming a stack precursor comprising alternating first materials and second materials comprises forming the first materials exhibiting a lower melting point than a melting point of the second materials.

4. The method of claim 1, wherein forming a stack precursor comprising alternating first materials and second materials comprises forming the alternating first materials and second materials exhibiting a melting point difference between about 5° C. and about 100° C.

5. The method of claim 1, wherein forming a stack precursor comprising alternating first materials and second materials comprises forming the alternating first materials and second materials in a substantially solid phase.

6. The method of claim 1, wherein removing a portion of the alternating first materials and second materials to form a pillar opening comprises removing the portion of the alternating first materials and second materials using a thermal etch process to form the pillar opening.

7. The method of claim 1, wherein removing a portion of the alternating first materials and second materials to form a pillar opening comprises forming the pillar opening at a temperature below the melting points of the first materials and the second materials.

8. The method of claim 1, wherein removing the first materials to form first spaces between the second materials comprises exposing the first materials to a temperature above the melting point of the first materials and below a melting point of the second materials.

9. The method of claim 8, wherein exposing the first materials to a temperature above the melting point of the first materials and below a melting point of the second materials comprises converting the first materials into a liquid phase.

10. The method of claim 8, wherein exposing the first materials to a temperature above the melting point of the first materials and below a melting point of the second materials comprises converting the first materials into a gas phase.

11. The method of claim 1, wherein removing the second materials to form second spaces between the conductive materials comprises exposing the second materials to a temperature above the melting point of the second materials.

12. A method of forming an electronic device comprising:
forming alternating first materials and second materials on a base material, the first materials and the second materials formulated to be removable at different temperatures and exhibiting melting points differing from one another by between about 5° C. and about 150° C.;
exposing a portion of the alternating first materials and second materials to a thermal process to form a pillar opening through the alternating first materials and second materials;
forming a sacrificial material in the pillar opening;
exposing the first materials to a temperature above a melting point of the first material and below a melting point of the second material to remove the first materials and to form first spaces;
forming a conductive material in the first spaces;
exposing the second materials to a temperature above a melting point of the second material to remove the second materials and to form second spaces;
forming a dielectric material in the second spaces;
removing the sacrificial material from the pillar opening; and
forming cell materials in the pillar opening.

13. The method of claim 12, wherein forming alternating first materials and second materials on a base material comprises forming alternating first materials selected from the group consisting of acetic acid, lactic acid, and formic acid and second materials comprising water.

14. The method of claim 12, wherein forming alternating first materials and second materials on a base material comprises forming alternating first materials comprising acetic acid and second materials comprising water.

15. The method of claim 12, wherein forming alternating first materials and second materials on a base material comprises forming alternating first materials selected from the group consisting of carbon dioxide, nitrogen, and nitrous oxide and second materials comprising water.

16. The method of claim 12, wherein forming alternating first materials and second materials on a base material comprises forming alternating photosensitive resist materials and thermally sensitive resist materials on the base material.

17. The method of claim 12, wherein forming alternating first materials and second materials on a base material comprises forming the first materials exhibiting a lower melting point than the second materials.

18. The method of claim 12, wherein forming alternating first materials and second materials on a base material comprises forming one of the first materials and second materials at room temperature.

19. The method of claim 12, wherein exposing a portion of the alternating first materials and second materials to a thermal process comprises exposing the portion of the alternating first materials and second materials to a non-reactive and directional thermal etch process.

20. The method of claim 12, wherein exposing a portion of the alternating first materials and second materials to a thermal process comprises exposing the portion of the alternating first materials and second materials to ultraviolet radiation.

21. The method of claim 12, wherein exposing a portion of the alternating first materials and second materials to a thermal process comprises exposing the portion of the alternating first materials and second materials to a laser.

22. The method of claim 12, wherein exposing a portion of the alternating first materials and second materials to a thermal process comprises exposing the portion of the alternating first materials and second materials to a thermal etch process conducted under vacuum conditions.

23. The method of claim 12, wherein forming a dielectric material in the second spaces comprises forming an oxide material in the second spaces.

24. The method of claim 12, wherein forming a dielectric material in the second spaces comprises forming air gaps in the second spaces.

25. A method of forming an electronic device comprising:
forming alternating first materials and second materials on a base material, the first materials and the second materials formed in a solid phase and the first materials and the second materials formulated to be removable at different temperatures;
exposing a portion of the alternating first materials and second materials to a thermal etch process to form a pillar opening through the alternating first materials and second materials;
forming a sacrificial material in the pillar opening;
removing the first materials to form first spaces between the second materials;
forming a conductive material in the first spaces;
removing the second materials to form second spaces between the conductive materials;
forming a dielectric material in the second spaces;
removing the sacrificial material from the pillar opening; and
forming cell materials in the pillar opening.

26. The method of claim 25, wherein forming alternating first materials and second materials on a base material comprises forming the first materials and second materials by spin coating, blanket coating, chemical vapor deposition, or physical vapor deposition.

27. The method of claim 25, wherein forming alternating first materials and second materials on a base material comprises forming the alternating first materials and second materials at a temperature below melting points of the first materials and the second materials.

28. The method of claim 25, wherein forming a conductive material in the first spaces comprises forming the conductive material to a gate length that substantially corresponds to a length of the first spaces.

* * * * *

UNITED STATES PATENT AND TRADEMARK OFFICE
CERTIFICATE OF CORRECTION

PATENT NO.       : 11,476,268 B2
APPLICATION NO.  : 16/887178
DATED            : October 18, 2022
INVENTOR(S)      : Chandra S. Tiwari and Kunal Shrotri It is certified that error appears in the above-identified patent and that said Letters Patent is hereby corrected as shown below:

In the Specification

| | | |
|---|---|---|
| Column 6, | Line 9, | change "("SOT")" to --("SOI")-- |
| Column 8, | Line 13, | change "Ta, the" to --$T_2$, the-- |

Signed and Sealed this
Seventeenth Day of January, 2023

Katherine Kelly Vidal
*Director of the United States Patent and Trademark Office*